United States Patent [19]
Pfiester

[11] Patent Number: 5,064,774
[45] Date of Patent: Nov. 12, 1991

[54] SELF-ALIGNED BIPOLAR TRANSISTOR PROCESS

[75] Inventor: Jame R. Pfiester, Austin, Tex.

[73] Assignee: Motorola, Inc., Schaumburg, Ill.

[21] Appl. No.: 632,693

[22] Filed: Feb. 19, 1991

[51] Int. Cl.⁵ .......................................... H01L 21/265
[52] U.S. Cl. ....................................... 427/31; 437/41; 437/46; 437/150; 437/156; 437/160; 437/162; 148/DIG. 10; 148/DIG. 11; 357/34
[58] Field of Search .................. 437/31, 46, 90, 41, 437/150, 156, 984, 160, 162, 32, 33; 357/34; 148/DIG. 10, DIG. 11, DIG. 157

[56] References Cited

U.S. PATENT DOCUMENTS

| | | | |
|---|---|---|---|
| 4,546,536 | 10/1985 | Anantha et al. | 437/46 |
| 4,824,786 | 4/1985 | Chio et al. | 437/31 |
| 4,839,305 | 6/1989 | Brighton | 437/31 |
| 4,908,324 | 3/1990 | Nihira et al. | 437/162 |
| 4,960,726 | 10/1990 | Lechaton et al. | 437/31 |
| 4,987,089 | 1/1991 | Roberts | 437/46 |
| 4,988,632 | 1/1991 | Pfiester | 437/150 |

FOREIGN PATENT DOCUMENTS

| | | | |
|---|---|---|---|
| 1-025569 | 1/1989 | Japan | 437/31 |
| 1-281766 | 11/1989 | Japan | 437/31 |

Primary Examiner—Brian E. Hearn
Assistant Examiner—Kevin Picardat
Attorney, Agent, or Firm—Robert L. King

[57] ABSTRACT

A fully self-aligned bipolar transistor having low emitter and base-resistances is formed in a semiconductor device. In one embodiment, a patterned masking layer is formed on an active device region of a semiconductor substrate. The patterned masking layer has an opening, within which a TiN sidewall spacer is formed. The active device region is selectively doped to form an intrinsic base, using the TiN sidewall spacer and patterned masking layer as a doping mask. An emitter electrode is formed on the intrinsic base by selective deposition of silicon. An extrinsic base is also formed in the active device region by doping. Self-aligned metal silicide contacts to the extrinsic base and the emitter electrode are formed and the TiN sidewall spacer is removed.

15 Claims, 3 Drawing Sheets

SELF-ALIGNED BIPOLAR TRANSISTOR PROCESS

CROSS-REFERENCE TO A RELATED APPLICATION

This application is related to my commonly assigned co-pending patent application entitled, "Bipolar Process Using Selective Silicon Deposition," by Pfiester, Ser. No. 07/459,845, filed Jan. 2, 1990.

TECHNICAL FIELD OF THE INVENTION

The present invention is related to semiconductor device fabrication in general, and more specifically, to fabrication of semiconductor devices having bipolar transistors.

BACKGROUND OF THE INVENTION

Semiconductor manufacturers are continually trying to reduce the size of individual devices within an integrated circuit in order to reduce the overall integrated circuit size. However in doing so, fabrication of the devices becomes more difficult, particularly for complex device types such as bipolar, BiMOS, and BiCMOS devices. In an effort to simplify fabrication of small, complex devices, manufacturers are attempting to incorporate as many self-aligned processing steps as possible in order to reduce the number of masking operations. In the fabrication of semiconductor devices having bipolar transistors, many self-aligned fabrication processes have been demonstrated, yet most bipolar devices formed from these processes also have undesirable levels of base and emitter resistance. Therefore, a need exists for an improved process for forming a bipolar transistor in a semiconductor device. More specifically, a need exists for a fully self-aligned process which forms a bipolar transistor having low base and emitter resistance.

BRIEF SUMMARY OF THE INVENTION

The previously mentioned needs are achieved, along with other advantages, with the present invention. In accordance with the present invention, a method for forming a self-aligned bipolar transistor in a semiconductor device is provided. In one form, a semiconductor substrate having an active device region is provided. A patterned masking layer having an opening therein is formed overlying the active device region. A sidewall spacer is formed within the opening of the patterned masking layer. The active device region is selectively doped to form a first base region, using the sidewall spacer and the patterned masking layer as a doping mask. An emitter electrode is formed on the first base region by selective deposition, and a second base region is formed in the active device region by doping. Metal silicide contacts to each of the second base region and emitter electrode are formed and the sidewall spacer is removed.

DETAILED DESCRIPTION OF A PREFERRED EMBODIMENT

Bipolar transistors in semiconductor devices take one of two conductivity forms, either NPN transistors or PNP transistors. While the description and figures included in this application discuss formation of an NPN transistor, the present invention can be used to form PNP transistors by modifying conductivity types. Likewise, the present invention can also be used in fabricating bipolar transistors in BiMOS and BiCMOS devices. Although bipolar devices can be fabricated in many ways and may appear to be structurally different from one another, bipolar devices always have three common elements, namely an emitter, a collector, and a base. In an NPN bipolar transistor, the emitter and collector have an N-type conductivity while the base has a P-type conductivity. In a PNP transistor, the conductivities for the elements is reversed.

In forming NPN bipolar transistors in an integrated circuit, some practices and fabrication techniques have become quite common. For instance, most integrated circuits are formed on a P-type silicon substrate. To form bipolar devices within this silicon substrate, an N-type epitaxial silicon layer is grown over the P-type substrate. Between a portion of the epitaxial layer and the substrate, a heavily doped N-type impurity is introduced to form an N+ buried layer which functions as a collector of the transistor. Although the method in which the collector is formed is not standardized in the semiconductor industry, the use of a buried layer as the collector is quite common. The remaining steps in forming an NPN transistor differ significantly from manufacturer to manufacturer. FIGS. 1-7 illustrate one example of the formation of a bipolar transistor in accordance with the present invention. It is important to realize that modifications in the fabrication process described and illustrated herein can be made without departing from the scope of the invention.

Figure 1:
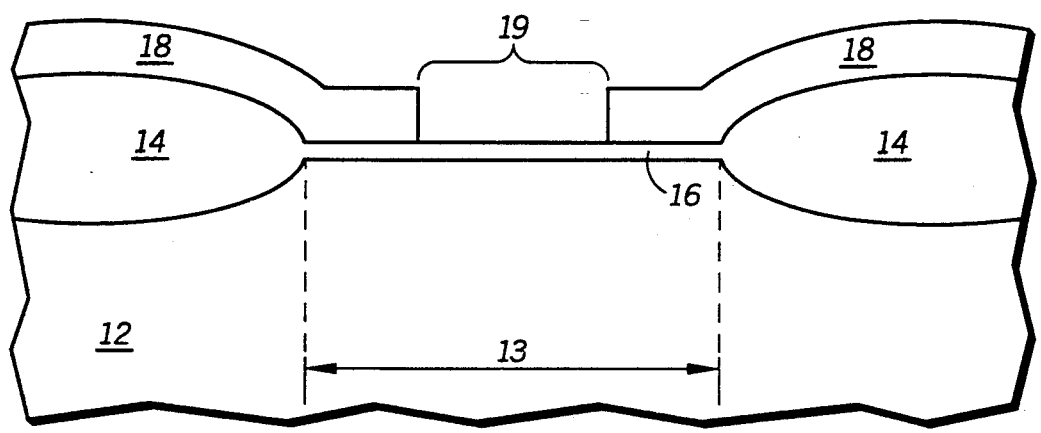
FIGS. 1-7 are a series of cross-sectional views illustrating the formation of a bipolar transistor in a semiconductor device, in accordance with the present invention.

FIG. 1 illustrates, in cross-section, an initial structure of a semiconductor device from which a self-aligned bipolar transistor is formed, in accordance with the present invention. A substrate 12 is a semiconductor of N-type conductivity for forming an NPN transistor, and P-type for forming a PNP transistor. Substrate 12 is usually a single crystal material of silicon or an epitaxial layer formed on another underlying substrate (not shown). Below substrate 12 may be a heavily doped buried layer (not shown) which is a collector of the bipolar transistor having opposite conductivity from substrate 12. Furthermore, a collector contact (not shown) may be included to electrically access the buried collector.

Also illustrated in FIG. 1 are isolation regions 14 which are typically made of a thick oxide material and are formed on substrate 12 by conventional methods. Other isolation regions can also be included in the device. Isolation regions are used to electrically isolate adjacent devices from one another, although FIGS. 1-7 illustrate only one device. Between isolation regions 14 and within substrate 12 is an active region 13. It is within active region 13 that the bipolar transistor is formed. Overlying active region 13 is an oxide layer 16 which, in one form of the present invention, serves as an etch stop, prevents damage to substrate 12 during doping, and isolates emitter and base contacts. Each of these purposes will be illustrated or described at a later point. A patterned masking layer 18 is formed overlying substrate 12 such that an opening 19 having walls is formed over active region 13. Materials used for masking layer 18 should be selected based on etch selectivity requirements which will be mentioned throughout this description. For instance, one requirement of masking layer 18 is that it can be etched selectively to isolation regions 14 and oxide layer 16. One suitable material for masking layer 18 is $Si_3N_4$.

Figure 2:
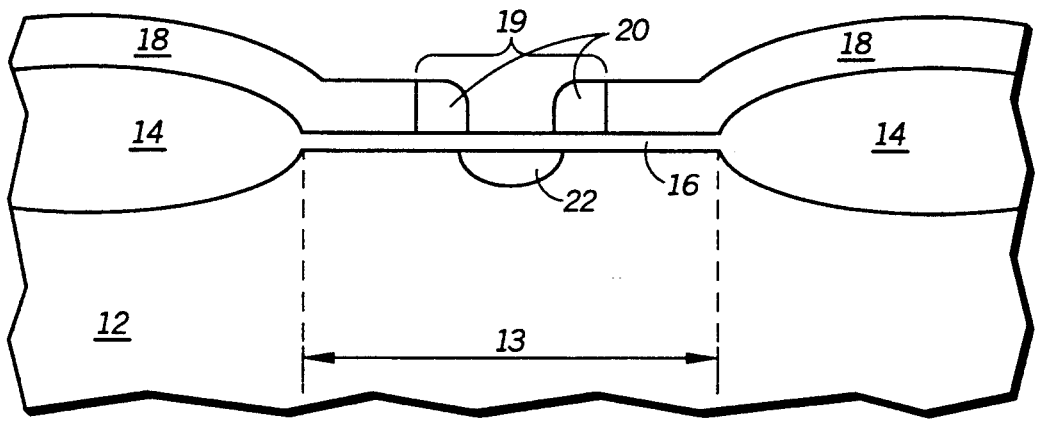

A sidewall spacer 20 is formed on the walls of opening 19, as illustrated in FIG. 2. Although illustrated as two sidewall spacers, one continuous sidewall spacer, which appears as two spacers when viewed in cross-section, may be formed in accordance with the present invention. However, it should be understood that the present invention may be practiced using two separate sidewall spacers. Materials for use in forming sidewall spacer 20 are those which can be etched selectively to masking layer 18 and underlying oxide layer 16. Likewise, masking layer 18 must have the ability to be etched without etching sidewall spacer 20. For example with a $Si_3N_4$ masking layer, TiN would be an appropriate material from which to form sidewall spacer 20. An intrinsic base 22 is formed within active region 13, as illustrated in FIG. 2. Intrinsic base 22 has a conductivity opposite from the conductivity of substrate 12. Intrinsic base 22 is formed by doping the device, for instance, with a P-type impurity such as boron in the case of an NPN transistor. Doping can be accomplished using ion implantation or another known doping procedure. Masking layer 18 and sidewall spacer 20 act as a doping mask during formation of the intrinsic base.

Figure 3:
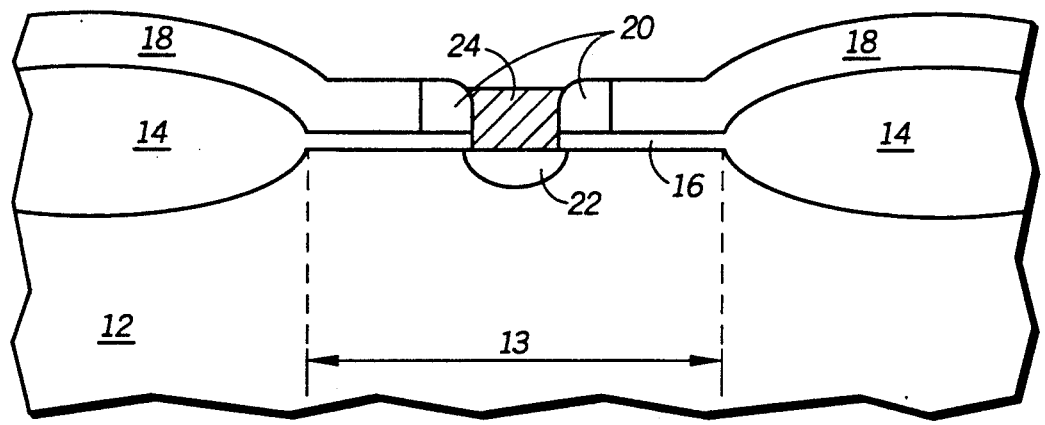

A portion of oxide layer 16 which lies above intrinsic base 22 may remain over active device region 13 during doping to prevent crystalline damage during ion implantation. However, this portion of oxide layer 16 must be removed either prior to or following formation of the intrinsic base in order to form an emitter electrode 24 as illustrated in FIG. 3. Oxide layer 16 can be removed by reactive ion etching or wet etching without damage to other portions of the device. Once a portion of oxide layer 16 is removed, emitter electrode 24 is formed by selective deposition of, for instance, amorphous, monocrystalline, or polycrystalline silicon. Selective deposition is a process of chemical vapor deposition in which the reaction is adjusted so that a material is deposited only on a prepared nucleation site. In the case of selective deposition of silicon, exposed portions of polycrystalline or monocrystalline silicon act as the nucleation site for deposition. With continued deposition, the selectively deposited silicon itself acts as a nucleating site so that additional silicon deposits on earlier deposits to extend silicon upwardly within sidewall spacer 20. The selectively deposited emitter electrode is self-aligned because it deposits only on the exposed intrinsic base 22. While selective deposition of silicon is more common than selective deposition of tungsten, aluminum, platinum, or the like, these materials can also be used in accordance with the present invention.

Figure 4:
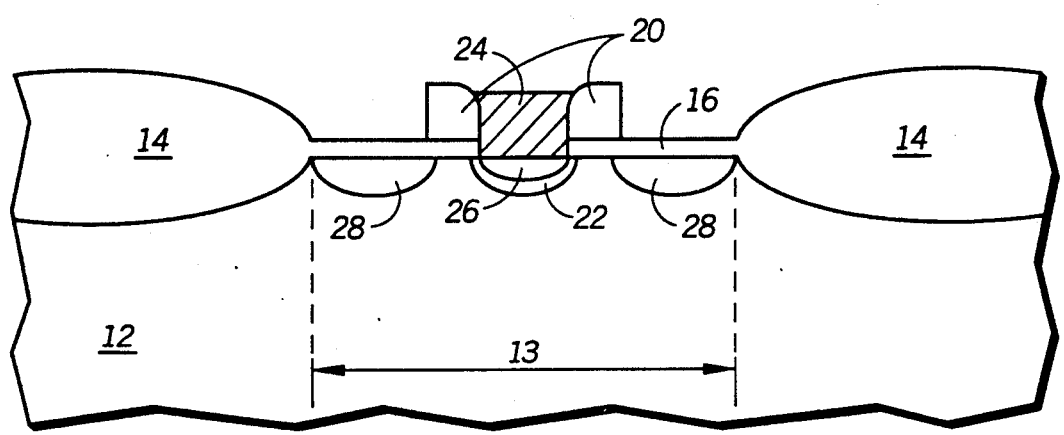

In order to form an emitter 26, as in FIG. 4, selectively deposited emitter electrode 24 may be insitu doped with an N-type impurity if substrate 12 is N-type or with a P-type impurity if substrate 12 is P-type. Emitter 26 is then formed by a diffusion of the impurities from emitter electrode 24 into the intrinsic base 22. Rather than insitu doping, emitter 26 may be formed by ion implantation or other doping technique following formation of intrinsic base 22 and prior to selectively depositing emitter electrode 24. Furthermore, intrinsic base 22 and/or emitter 26 can be formed following formation of emitter electrode 24. For instance, an undoped emitter electrode may be selectively deposited and then heavily doped to form intrinsic base 22 and/or emitter 26.

Once emitter 26 and emitter electrode 24 are formed, masking layer 18 is removed from the device, as also illustrated in FIG. 4. Removal of masking layer 18 is accomplished using conventional etching procedures, without substantially etching sidewall spacer 20, oxide layer 16, or isolation regions 14. For the case in which masking layer 18 is $Si_3N_4$ and sidewall spacer 20 is TiN, a plasma etch mixture of $CHF_3$, $CF_4$, and argon or a wet etch using heated phosphoric acid will achieve the desired result. Following removal of masking layer 18, the device is doped again to form an extrinsic base 28 which is of the same conductivity as intrinsic base 22. Extrinsic base 28 can be formed, for example, by ion implantation. Just as sidewall spacer 20 appears as two individual spacers, extrinsic base 28 may be one base which when viewed in cross-section appears as two or it may indeed be two extrinsic base regions. Also, as in the formation of intrinsic base 22, oxide layer 16 may remain above active device region 13 during doping to reduce crystalline damage, however must be removed at a point in the processing to expose extrinsic base 28. Removal of oxide layer 16 is accomplished, for example, by reactive ion etching.

Figure 5:
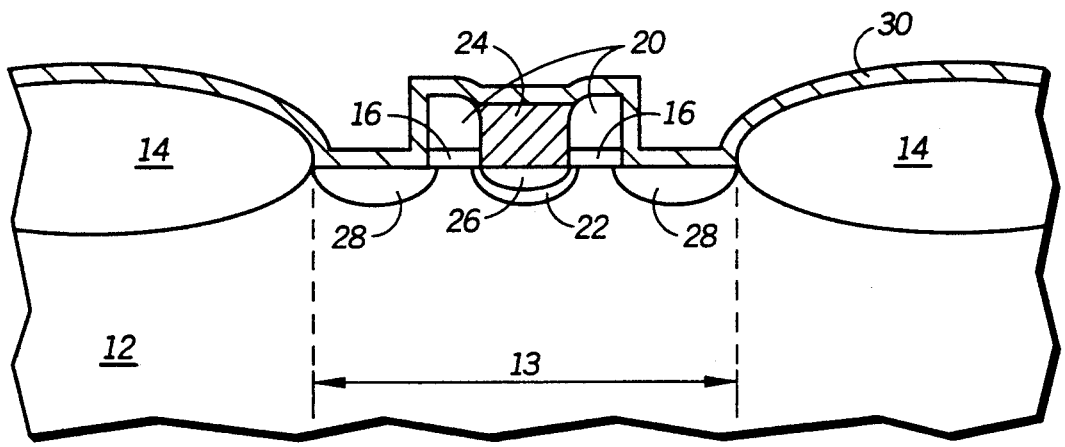
Figure 6:
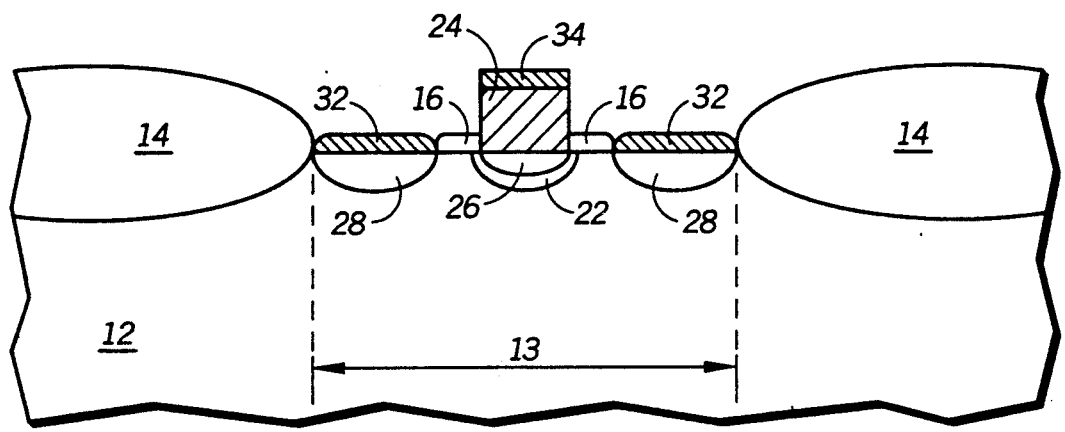

After exposing extrinsic base 28, a refractory metal layer 30, such as titanium or cobalt, is deposited over the device as illustrated in FIG. 5. Notice that refractory metal layer 30 is not only in direct contact with extrinsic base 28, but also with emitter electrode 24. This condition enables silicide contacts to be formed on the extrinsic base 28 and on emitter electrode 24. FIG. 6 illustrates these contacts, namely a silicide base contact 32 and a silicide emitter contact 34. Silicidation is a process in which a refractory metal in contact with silicon undergoes a metallurgical reaction, particularly during a thermal cycle, to form a refractory metal of silicide. A refractory metal silicide is a compound containing both refractory metal and silicon atoms. An example of a known silicidation process is to react titanium with silicon to form $TiSi_2$. With respect to FIG. 5, silicidatin will only occur on those portions of the device in which the refractory metal layer 30 is in contact with substrate 12 and emitter electrode 24. Thus, silicide contacts are formed on extrinsic base 28 which is within the substrate and on emitter electrode 24. Because the contact formation does not involve any masking or lithography steps, it is self-aligned silicide process, also referred to as a salicide process.

Those portions of refractory metal layer 30 which do not contact silicon or polysilicon do not undergo a metallurgical reaction, for example those portions which are in contact with sidewall spacer 20 and isolation regions 14. The unreacted portions are removed, as illustrated in FIG. 6, while reacted portions, silicide base contact 32 and silicide emitter contact 34, remain substantially intact. It is advantageous to also remove sidewall spacer 20 simultaneously with the removal of unreacted portions of refractory metal layer 30. For instance, a TiN sidewall spacer can be removed easily during the removal of unreacted titanium by using a heated hydrogen peroxide solution or a hydrogen peroxide and ammonia hydroxide solution. If sidewall spacer 20 cannot be removed at the time the unreacted refractory metal is removed, an additional processing step to do so is required.

Figure 7:
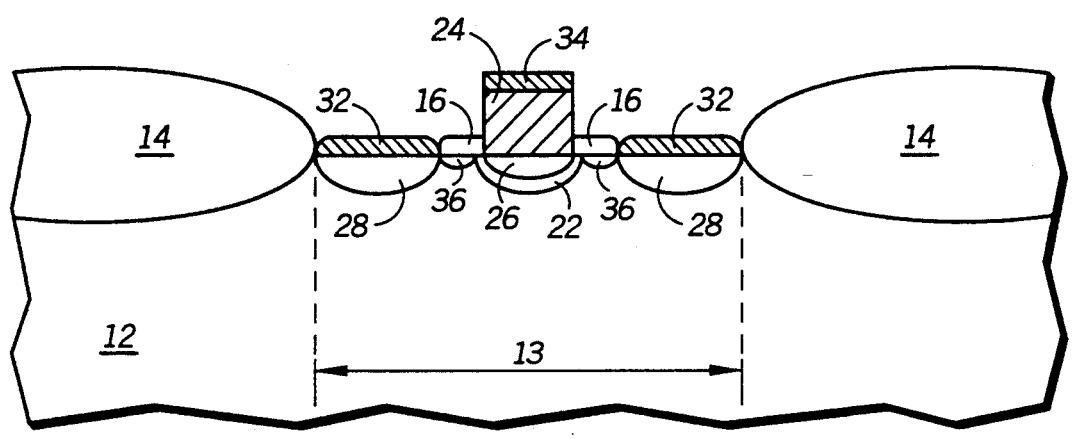

A remaining step is to lightly dope the device to form a link region 36 which adjoins extrinsic base 28 with intrinsic base 22. Link region 36 is illustrated in FIG. 7, and is of the same conductivity type as the extrinsic and intrinsic bases. No masking is required in forming link region 36. Other portions of the device will also be doped. However, the doping concentration required to form link region 36 is much lower than the doping concentrations of other portions of the device, and therefore will have no impact on performance of the device. Because the link region is formed as one of the last steps in forming a bipolar transistor in accordance with the present invention, the link region can remain shallow. Many bipolar processes perform a link implant earlier and thus have a disadvantage in that the link region diffuses, in other words becomes deeper, during thermal cycles of subsequent processing steps. Shallow link regions, such as link region 36 in FIG. 7, are desirable to reduce series resistance in the base regions.

The present invention has several advantages over known bipolar transistor fabrication processes. One advantage is that a bipolar transistor formed in accordance with the present invention has lower base and emitter resistance than other bipolar transistors. Because the extrinsic base and emitter contacts are formed of silicide, base and emitter resistance is improved. In addition, the present invention provides for a fully self-aligned structure which enables the emitter and extrinsic base regions to be in very close proximity to one another while maintaining a large surface area, thus further reducing resistance. The self-aligned bipolar transistor taught herein not only has reduced resistance, but also simplifies the fabrication process particularly for very small devices. Another advantage, as discussed earlier, is that a link region is formed relatively late in the fabrication process and therefore remains shallow.

Thus, it is apparent that there has been provided, in accordance with the present invention, a process for forming a self-aligned bipolar transistor in a semiconductor device that fully meets the advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, use of the invention is not limited to the materials, etching techniques, doping techniques, or deposition techniques specifically described or illustrated. Any material or process which achieves the desired result of a particular element in accordance with the present invention is suitable and within the scope of the invention. Furthermore, the described process can be used to form PNP or NPN transistors or both, either alone or in combination with N-channel, P-channel, or CMOS transistors. While the description has emphasized the used of a silicon substrate and selective deposition of either amorphous, monocrystalline, or polycrystalline silicon, the invention is not limited to use of these materials. Therefore, it is intended that this invention encompass all such variations and modifications as fall within the scope of the appended claims.

I claim:

1. A process for forming a self-aligned bipolar transistor in a semiconductor device, comprising the steps of:

providing a semiconductor substrate having an active device region and an oxide layer overlying the active device region;

forming a patterned dielectric layer overlying the active device region and the oxide layer and having an opening bounded by a wall which exposes a portion of the oxide layer;

forming a TiN sidewall spacer on the wall of the patterned dielectric layer;

selectively doping the active device region to form a first base region using the TiN sidewall spacer and the patterned dielectric layer as a doping mask;

removing the exposed portion of the oxide layer within the opening using the TiN sidewall spacer and the patterned dielectric layer as an etch mask to form an exposed portion of the active device region;

forming an emitter electrode by selective deposition of a predetermined material on the exposed portion of the active device region;

removing the patterned dielectric layer;

doping the active device region to form a second base region;

forming a metal silicide contact to each of the second base region and the emitter electrode; and removing the TiN sidewall spacer.

2. The process of claim 1 further comprising the step of doping the active device region to form a link region adjoining the first and second base regions, following the step of removing the TiN sidewall spacer.

3. The process of claim 1 wherein the step of forming an emitter electrode comprises forming an emitter electrode by selective deposition of silicon.

4. The process of claim 3 wherein the step of forming an emitter electrode comprises forming an emitter electrode by selective deposition of insitu doped N-type silicon.

5. The process of claim 1 wherein the step of forming a patterned dielectric layer comprises forming a patterned $Si_3N_4$ layer.

6. The process of claim 1 wherein the step of forming metal silicide contacts comprises forming one of either cobalt silicide or titanium silicide contacts.

7. A process for forming a self-aligned bipolar transistor in a semiconductor device, comprising the steps of:

providing a substrate having an active device region;

forming a patterned masking layer overlying the active device region and having an opening therein;

forming a sidewall spacer within the opening of the patterned masking layer;

selectively doping the active device region to form a first base region using the sidewall spacer and the patterned masking layer as a doping mask;

forming an emitter electrode by selective deposition of a predetermined material which overlies the first base region;

doping the active device region to form a second base region;

forming a metal silicide contact to each of the second base region and the emitter electrode; and removing the sidewall spacer.

8. The process of claim 7 wherein the step of forming an emitter electrode comprises forming an emitter electrode by selective deposition of silicon.

9. The process of claim 7 further comprising the step of selectively doping the active device region to form an emitter region using the sidewall spacer and the patterned masking layer as a doping mask, prior to the step of forming an emitter electrode.

10. The process of claim 7 further comprising the step of doping the active device region to form a link region adjoining the first and second base regions.

11. The process of claim 7 wherein the step of forming metal silicide contacts comprises forming one of either cobalt silicide or titanium silicide.

12. The process of claim 7 wherein the step of forming a sidewall spacer comprises forming a TiN sidewall spacer within the opening of the patterned masking layer.

13. A process for forming a self-aligned bipolar transistor in a semiconductor device, comprising the steps of:
   providing a substrate having an active device region and an oxide layer overlying the active device region;
   forming a patterned masking layer overlying the active device region and having an opening therein bounded by a wall;
   forming a TiN sidewall spacer on the wall of the patterned masking layer;
   selectively doping the active device region to form a first base region using the TiN sidewall spacer and the patterned masking layer as a doping mask;
   removing a first portion of the oxide layer within the opening using the TiN sidewall spacer and the patterned masking layer as an etch mask to form a first exposed portion of the active device region;
   forming an emitter electrode by selective deposition of silicon on the first exposed portion of the active device region;
   removing the patterned masking layer and a second portion of the oxide layer to form a second exposed portion of the active device region;
   doping the second exposed portion of the active device region to form a second base region;
   forming metal silicide contacts to the second base region and the emitter electrode;
   removing the TiN sidewall spacer; and
   doping the active device region to form a link region which connects the first and second base regions.

14. The process of claim 13 wherein the step of forming a patterned masking layer comprises forming a patterned masking layer of $Si_3N_4$ overlying the active device region and having an opening therein bounded by a wall.

15. The process of claim 13 wherein the step of forming metal silicide contacts comprises forming one of either cobalt silicide or titanium silicide contacts.

* * * * *